(12) United States Patent
Okamoto et al.

(10) Patent No.: US 8,466,528 B2
(45) Date of Patent: Jun. 18, 2013

(54) SEMICONDUCTOR LIGHT-RECEIVING ELEMENT, OPTICAL COMMUNICATION DEVICE, OPTICAL INTERCONNECT MODULE, AND PHOTOELECTRIC CONVERSION METHOD

(75) Inventors: Daisuke Okamoto, Tokyo (JP); Junichi Fujikata, Tokyo (JP)

(73) Assignee: NEC Corporation, Tokyo (JP)

( * ) Notice: Subject to any disclaimer, the term of this patent is extended or adjusted under 35 U.S.C. 154(b) by 178 days.

(21) Appl. No.: 13/003,792

(22) PCT Filed: Jun. 23, 2009

(86) PCT No.: PCT/JP2009/002859
§ 371 (c)(1),
(2), (4) Date: Jan. 12, 2011

(87) PCT Pub. No.: WO2010/021073
PCT Pub. Date: Feb. 25, 2010

(65) Prior Publication Data
US 2011/0110628 A1 May 12, 2011

(30) Foreign Application Priority Data
Aug. 18, 2008 (JP) .................. 2008-209455

(51) Int. Cl.
*H01L 31/0232* (2006.01)
(52) U.S. Cl.
USPC ......... 257/432; 257/E31.127; 385/37; 438/69
(58) Field of Classification Search
USPC ............... 257/432, E31.127; 385/37; 438/69, 438/71
See application file for complete search history.

(56) References Cited

U.S. PATENT DOCUMENTS

| 5,227,648 | A | * | 7/1993 | Woo | 257/185 |
| 7,013,064 | B2 | * | 3/2006 | Wang | 385/37 |
| 7,629,663 | B2 | * | 12/2009 | Pardo et al. | 257/448 |
| 2006/0151807 | A1 | * | 7/2006 | Pardo et al. | 257/184 |
| 2010/0316083 | A1 | * | 12/2010 | Chang-Hasnain et al. | 372/50.11 |

FOREIGN PATENT DOCUMENTS

| JP | 9-23022 A | 1/1997 |
| JP | 10-509806 A | 9/1998 |
| JP | 2006501638 A | 1/2006 |
| JP | 2007273832 A | 10/2007 |
| WO | 2004012275 A | 2/2004 |
| WO | 2008072688 A | 6/2008 |

OTHER PUBLICATIONS

D. Okamoto et al., "Numerical Study of Near-Infrared Photodetectors with Surface-Plasmon Antenna for Optical Communication", Japanese Journal of Applied Physics, vol. 47, No. 4, Apr. 2008, pp. 2921-2923.

* cited by examiner

*Primary Examiner* — Allan R Wilson

(57) ABSTRACT

Provided is a high-speed and highly efficient semiconductor light-receiving element with small dependence on an incident light polarization direction. A semiconductor light-receiving element according to one aspect of the present invention includes a semiconductor layer including a light-absorbing layer 4, an MSM electrode 1 that is provided over the semiconductor layer, forms a Schottky junction with the semiconductor layer, and includes a slit-like opening, an anti-reflective film 2 formed over the semiconductor layer and the MSM electrode 1, and a Bragg reflection multilayer film 6 provided to a lower part of the semiconductor layer. The MSM electrode 1 includes a period capable of exciting surface plasmon to incident light of TM polarization, and obtains sufficient transmittance to the incident light of TE polarization.

11 Claims, 5 Drawing Sheets

SEMICONDUCTOR LIGHT-RECEIVING ELEMENT, OPTICAL COMMUNICATION DEVICE, OPTICAL INTERCONNECT MODULE, AND PHOTOELECTRIC CONVERSION METHOD

The present application is the National Phase of PCT/JP2009/002859, filed Jun. 23, 2009, which claims priority rights of and is based on Japanese Patent Application No. 2008-209455 filed on Aug. 18, 2008, the entire contents of which are hereby incorporated by reference.

TECHNICAL FIELD

The present invention related to a semiconductor light-receiving element, an optical communication device, an optical interconnect module, and a photoelectric conversion method, and particularly to a semiconductor light-receiving element that convert an optical signal including infrared and ultraviolet, which is required in a communication field and information processing, into an electric signal at high-speed and also highly efficiently, and an optical communication device, an optical interconnect module, and a photoelectric conversion method that use the same.

BACKGROUND ART

In order to convert the optical signal into the electric signal at a high speed, a photodiode using a photoelectric conversion phenomenon within semiconductor is often used. As the kinds of photodiode, there are a pn type, a pin type, a Schottky type, an MSM (Metal-Semiconductor-Metal) type, or the like. The main factors to limit response speed of photoelectric conversion in the photodiode are circuit time constant determined by a product of electric capacitance made by a depletion layer and a load resistance, and carrier transit time required for a carrier to pass the depletion layer. In order to improve the responsiveness of the photodiode, it is required to reduce the circuit time constant and the carrier transit time. Further, the photodiode is required to be highly efficient and have small dependence on an incident light polarization direction other than high-speed capability.

One of the photodiode capable of a high-speed response is the MSM type. This is expected as a photoelectric conversion element used in the information processing and communication field. This MSM type photodiode is, in general, a kind of the Schottky photodiode that has a Schottky barrier near each of two electrodes. In the MSM type photodiode, by using an electrode which has a comb-like structure, it is possible to apply a high electric field to a light-absorbing layer at a low voltage and reduce the transit time of the carrier, and thereby achieving relatively fast response speed.

On the other hand, since incident light is reflected by an electrode on a light-receiving surface, there has been a problem of reduced quantum efficiency. Moreover, there has been a trade-off relationship in which in order to improve the responsiveness, when the light-absorbing layer is thinned and the carrier transit time is shortened, the efficiency is reduced. In recent years, various attempts have been made to improve the speed and efficiency of the MSM type photodiode than has heretofore been the case using metal surface plasmon.

For example, in a photoelectric coupler disclosed in Patent Literature 1, a device configuration is used in which inter-digitated metal electrodes, which are periodically arranged over a flat semiconductor surface, are disposed so that positive and negative electrodes are nested and face each other. Patent Literature 1 describes an MSM type photodiode that is made by coupling between incident light and surface plasmon by resonance. Further, it is mentioned that a diffracted wave generated by the metal electrode is coupled to a local wave, and is confined in a waveguide. However, the configuration of the metal electrode that efficiently generates the diffracted light by the surface plasmon resonance is not mentioned.

Further, as for the method to couple the diffracted light to the waveguide formed by the light-absorbing layer, only a wavenumber matching condition is written, and the waveguide structure and positional relationship with the metal electrode for improving coupling efficiency is not mentioned. Accordingly, in the MSM type photodiode disclosed in Patent Literature 1, since efficiency for generating the diffracted light of a desired order is low, and the coupling efficiency with the waveguide formed by the light-absorbing layer is low, consequently the quantum efficiency becomes low. In addition, in the MSM type photodiode disclosed by Patent Literature 1, dependence on the incident light polarization direction is large, and efficiency is remarkably reduced to a polarization direction that cannot excite the surface plasmon.

Patent Literature 2 describes an MSM type photodiode with improved efficiency even in the case of a thin light-absorbing layer by providing a Bragg reflection mirror to a lower part of the light-absorbing layer to form a cavity configuration with an electrode as an upper mirror, and confining zero-order transmitted light.

In order to obtain enough efficiency in the MSM type photodiode disclosed in Patent Literature 2, it is necessary to increase Q value of the cavity. However, it is difficult to permit light to enter the cavity with high Q value in the first place, thus the incident light is reflected by the electrode functioning as an upper mirror before entering the cavity. As a result, it is difficult to obtain sufficient quantum efficiency.

Patent Literature 3 mentions that a multiple quantum well layer as a core layer is sandwiched between upper and lower clad layers to form an optical waveguide, and light is absorbed by the multiple quantum well layer. However, it is not mentioned to improve the efficiency of the MSM type photodiode using the diffracted light.

CITATION LIST

Patent Literature

[Patent Literature 1] Published Japanese Translation of PCT International Publication for Patent Application, No. 10-509806

[Patent Literature 2] Published Japanese Translation of PCT International Publication for Patent Application, No. 2006-501638

[Patent Literature 3] Japanese Unexamined Patent Application Publication No. 9-023022

SUMMARY OF INVENTION

Technical Problem

As mentioned above, in the MSM type light-receiving element or a photodiode that do not use the surface plasmon resonance, there is a problem that the quantum efficiency is not high due to the reflection by the metal electrode, and the improvement in the quantum efficiency and response speed is in the trade-off relationship. Further, in the MSM type photodiode which couples the diffracted light to the optical waveguide in an attempt to increase the efficiency, only by combining the metal electrode and the optical waveguide, there is a problem that as the generation efficiency of the diffracted light is low and the coupling efficiency of the diffracted light and the optical waveguide is low, sufficient quantum efficiency cannot be obtained and also the dependence on the incident light polarization direction is large.

The present invention is made in light of such circumstances, and an object of the present invention is to provide a semiconductor light-receiving element and a photoelectric conversion method with small dependence on the incident light polarization direction at a high speed and highly efficiently.

Solution to Problem

A semiconductor light-receiving element according to one aspect of the present invention includes a semiconductor layer including a light-absorbing layer, a metal periodic structure that is provided over the semiconductor layer, forms a Schottky junction with the semiconductor layer, and includes a slit-like opening, an anti-reflection film formed over the semiconductor layer and the metal periodic structure, and a semiconductor multilayer reflective film provided to a lower part of the semiconductor layer. The metal periodic structure has a period capable of exciting surface plasmon to incident light of polarization vertical to a longitudinal axial direction of the slit-like opening, and a thickness capable of obtaining sufficient transmittance to the incident light of the polarization parallel to the longitudinal axial direction of the slit-like opening.

A photoelectric conversion method according to another aspect of the present invention includes diffracting light by a metal periodic structure that is provided over a semiconductor layer, forms a Schottky junction with the semiconductor layer, includes a slit-like opening, and has a period capable of exciting surface plasmon to incident light of polarization vertical to a longitudinal axial direction of the slit-like opening and a thickness capable of obtaining sufficient transmittance to the incident light of the polarization parallel to the longitudinal axial direction of the slit-like opening, resonating the light diffracted by the metal periodic structure between the metal periodic structure and a semiconductor multilayer reflective film that is provided to a lower part of the semiconductor layer, and coupling the light diffracted by the metal periodic structure to a light-absorbing layer included in the semiconductor layer.

Advantageous Effects of Invention

According to the present invention, it is possible to achieve a semiconductor light-receiving element and a photoelectric conversion method with small dependency on the incident light polarization direction at a high speed and highly efficiently.

DESCRIPTION OF EMBODIMENTS

Next, embodiments of the present invention are described in detail with reference to the drawings.

First Embodiment

Figure 1:
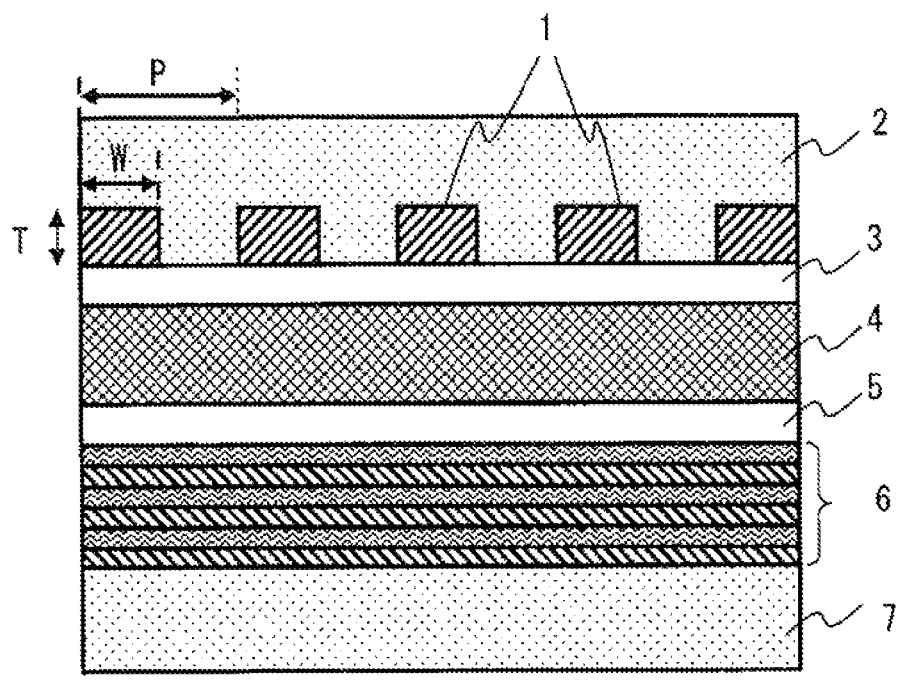
FIG. 1 is a cross-sectional diagram showing a configuration of a semiconductor light-receiving element according to a first embodiment.

A semiconductor light-receiving element according to a first embodiment of the present invention is explained with reference to FIG. 1. FIG. 1 is a cross-sectional diagram showing a configuration of the semiconductor light-receiving element according to the first embodiment. Here, an MSM type photodiode is explained as the semiconductor photo detector.

As shown in FIG. 1, an MSM type photodiode according to this embodiment includes an MSM electrode 1, an anti-reflection film 2, an upper spacer layer 3, a light-absorbing layer 4, a lower spacer layer 5, a Bragg reflection multilayer film 6, and a substrate 7. The Bragg reflection multilayer film 6 is disposed over the substrate 7. The Bragg reflection multilayer film 6 is a semiconductor reflective multilayer film.

The lower spacer layer 5, the light-absorbing layer 4, and the upper spacer layer 3 are sequentially laminated over the Bragg reflection multilayer film 6. Accordingly, the upper spacer layer 3 and the lower spacer layer 5 are respectively disposed above and below the light-absorbing layer 4. Here, the semiconductor layer is composed of the lower spacer layer 5, the light-absorbing layer 4, and the upper spacer layer 3. The MSM electrode 1 is disposed over the upper spacer layer 3. The anti-reflection film 2 composed of insulator is provided over the MSM electrode 1 and the semiconductor layer.

A Schottky junction is formed in a part where the MSM electrode 1 contacts the upper spacer layer 3, the light-absorbing layer 4 is depleted, and a generated photo carrier is taken out to an external circuit and is converted into an electric signal. The MSM electrode 1 is connected to the external circuit, such as a load resistor and a bias power supply.

In the case of the MSM electrode, the MSM electrode generally has a comb-like structure. In this case, in the light-receiving part, an electrode has a slit array or a stripe structure. Accordingly, the MSM electrode 1 has a metal periodic structure with a slit-like opening. Polarization light vertical to a longitudinal axial direction of the slit-like opening is referred to as TM (Transverse Magnetic) polarization, and polarization light parallel to longitudinal axial direction of the slit-like opening is referred to as TE (Transverse Electric) polarization. The MSM electrode 1 has a periodic structure, and it is possible to induce surface plasmon resonance to the TM polarization, and has a structure with sufficient transmittance also to the TE polarization.

However, it is not necessary to have the comb-like structure, and may be the configuration where concentric metal electrodes are nested. Additionally, the MSM electrode 1 may be composed from a plurality of period directions, a plurality of periods, or a plurality of width interval ratios (duty ratio).

The upper spacer layer 3 is composed of a semiconductor transparent to incident light, and has a function to improve efficiency of the light diffracted by the MSM electrode 1 to couple to the light-absorbing layer 4. The lower spacer layer 5 is composed of a semiconductor transparent to the incident light, and has a function to adjust a phase in a Fabry Perot resonator. The light-absorbing layer 4 is composed of a semiconductor with a refractive index higher than the upper spacer layer 3. The lower spacer layer 5 is composed of a semiconductor with the refractive index smaller than the light-absorbing layer 4. In this way, by making the refractive index of the light-absorbing layer 4 higher than the refractive index of the upper spacer layer 3 and the lower spacer layer 5, it is possible to achieve a stronger light confinement effect to the light-absorbing layer 4, and achieving higher efficiency. The incident light may enter from the substrate side.

As a material of the MSM electrode 1, a conductive metal is preferred. Specifically, a material with a few surface plasmon losses and small electric resistance, such as Ag or Au, is especially preferred. However, it is not limited to these metals, and Al or Cu may be used which has been widely used in the semiconductor device and many processing techniques have been established.

If the adhesion of the metal used for the MSM electrode 1 with the upper spacer layer 3 is poor, Ti, Ta, Cr, W, Ni, or the like can also be provided under the MSM electrode 1 as an adhesion layer. The film thickness of this adhesion layer is preferably 10 nm or less so as to reduce an optical loss. As material of anti-reflection film 2, $SiO_2$, SiON, SiN, or the like that can be easily formed and achieves a stable film is especially preferable.

As for the light-absorbing layer 4, semiconducting materials, such as $Si_xGe_{1-x}$, Ge, GaN, GaAs, and InGaAs, can be used. Further, a favorable Schottky junction is obtained by using the semiconducting material, such as Si and InAlAs for the upper spacer layer 3, and they are especially preferable. The lower spacer layer 5 may be an insulator, such as SiO2, or may be a semiconductor, such as Si, InAlAs, and InP. A combination, such as $Si/SiO_2$, InGaAsP/InP, and InGaAsP/InAlAs, can be used for the Bragg reflection multilayer film 6.

The upper spacer layer 3, the light-absorbing layer 4, and the lower spacer layer 5 may be a laminated structure of a plurality of semiconductor materials, and an optimal material can be chosen according to the substrate to manufacture the photodiode or an incident light wavelength. For example, if Si is used as the material of the substrate 7, Si can be used for the upper spacer layer 3, SiGe or Ge can be used for the light-absorbing layer 4, and $SiO_2$ can be used for the lower spacer layer 5. For example, if InP is used as the material of the substrate 7, InAlAs can be used for the upper spacer layer 3, and InGaAs can be used for the light-absorbing layer 4, and InAlAs can be used for the lower spacer layer 5.

In order to reduce reflection by the electrode, efficiently generate the diffracted light, form a the Fabry Perot resonator which is efficient to both of the TM polarization and the TE polarization, and improve the quantum efficiency of the photodiode, a period, a thickness, a duty ratio, or the like of the MSM electrode 1 will be very important parameters. Next, a result of electromagnetic field simulation computation to these parameters is described.

Here, a wavelength in vacuum of incident light shall be $\lambda$, the refractive index of the anti-reflection film 2 shall be $n_1$, the refractive index of the upper space layer 3 shall be $n_2$, the period of the MSM electrode 1 shall be P, the width shall be W, and the thickness shall be T. Further, duty ratio R is defined as W/P.

Figure 2:
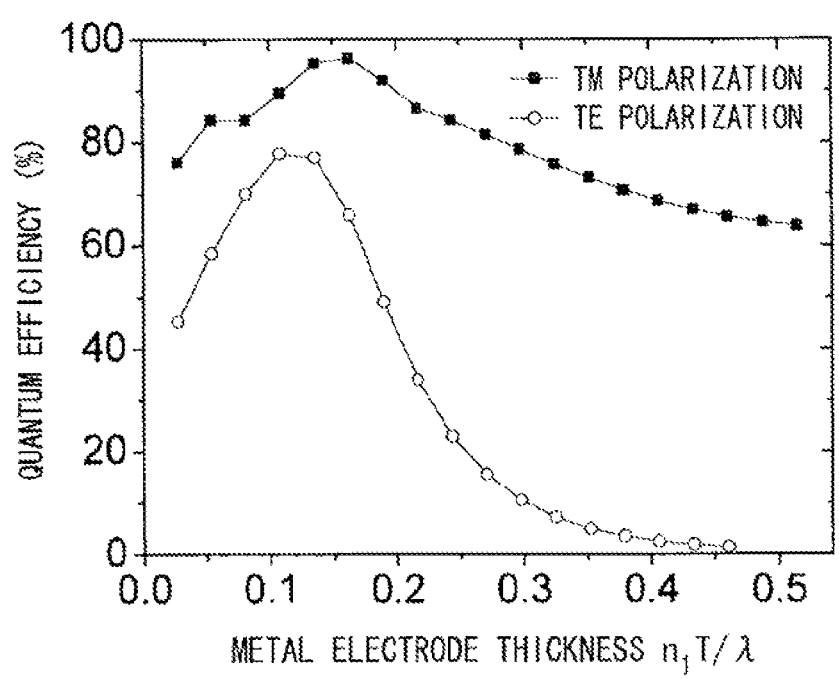
FIG. 2 is a view showing thickness T dependence of an MSM electrode of quantum efficiency.

FIG. 2 is a view showing the thickness T dependence of the MSM electrode 1 of the quantum efficiency on the TM polarization and the TE polarization. In FIG. 2, the horizontal axis takes values of the thickness T of the MSM electrode 1 standardized by $\lambda/n_1$, and the vertical axis takes the quantum efficiency. Here, the incident light wavelength $\lambda$ is 1550 nm, the MSM electrode 1 is Au, the anti-reflection film 2 is SiN, the upper spacer layer 3 is InAlAs, the light-absorbing layer 4 is InGaAs, the lower spacer layer 5 is InAlAs, and the period P of the MSM electrode 1 is 480 nm.

As shown in FIG. 2, a peak in the case of the TM polarization and a peak in the case of the TE polarization do not match, however in order to obtain high quantum efficiency of not less than about 50% to both of the TM polarization and the TE polarization, it can be seen that the relationship of $0.05<n_1 T/\lambda<0.20$ should be satisfied. This indicates that by providing the anti-reflection film 2 and the thickness satisfying $n_1 T/\lambda<0.20$, the MSM electrode 1 as a metal electrode has enough transmittance to the TE polarization, and the efficient Fabry Perot resonator can be formed between the Bragg reflection multilayer films 6.

Figure 3:
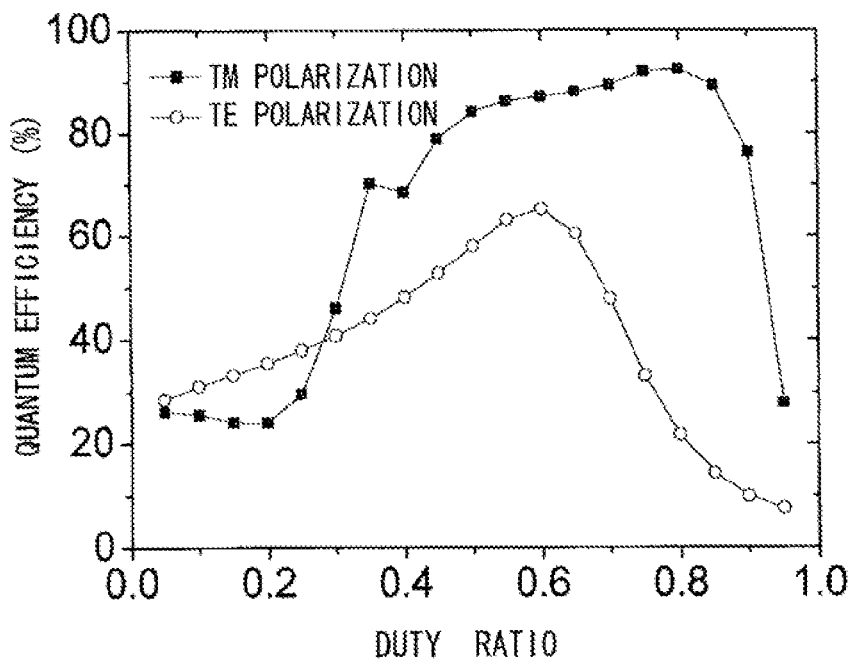
FIG. 3 is a view showing MSM electrode duty ratio R dependence of the quantum efficiency.

Moreover, along with the metal electrode thickness T, the duty ratio R is important for both polarizations to improve the efficiency. FIG. 3 is a view showing the duty ratio R dependence of the quantum efficiency on the TM polarization and the TE polarization. As shown in FIG. 3, a peak in the case of the TM polarization and a peak in the case of the TE polarization do not match, however in order to obtain high quantum efficiency of not less than about 50% to both of the TM polarization and the TE polarization, the relationship of $0.4<R<0.7$ should be satisfied.

That is, by satisfying $0.05<n_1 T/\lambda<0.20$ and $0.4<R<0.7$ at the same time, although the TM polarization, in which the surface plasmon is efficiently excited, can obtain higher quantum efficiency, it is possible to obtain the quantum efficiency of not less than about 50% also to the TE polarization, and as a result, polarization dependence is reduced.

Figure 4:
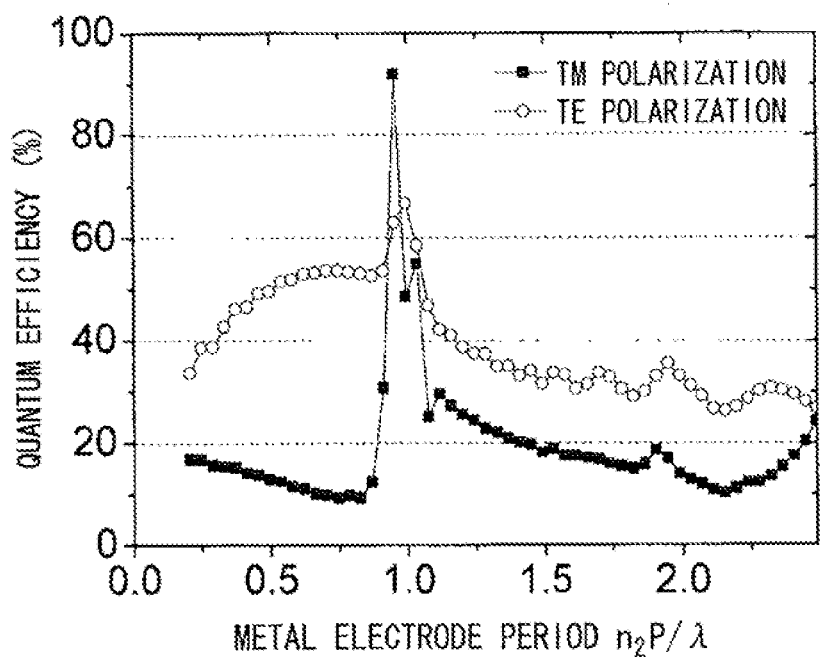
FIG. 4 is a view showing MSM electrode period P dependence of the quantum efficiency.

FIG. 4 is a view showing the periodic P dependence of the quantum efficiency on the TM polarization and the TE polarization. In FIG. 4, the horizontal axis takes values of the period P standardized by $\lambda/n_2$, and the vertical axis takes the quantum efficiency. As shown in FIG. 4, it can be seen that by satisfying the relationship of $0.90<n_2 P/\lambda<1.05$, high quantum efficiency can be obtained by the effect of diffraction, and high quantum efficiency of not less than about 50% is obtained to both of the TM polarization and the TE polarization.

In the present invention, in the case that the incident light is the polarization (TM polarization) vertical to the longitudinal axial direction of the slit-like opening, the incident light is coupled to the surface plasmon that propagates along the waveguide part of the MSM electrode 1. By adjusting the period of the MSM electrode 1, it is possible to improve the generation efficiency of the diffracted light that has a wave-number coupled to the optical waveguide formed by the light-absorbing layer 4. In addition, by providing the upper spacer layer, 3 which does not absorb light, between the MSM electrode 1 and the light-absorbing layer 4, and adjusting the thickness thereof, the coupling efficiency of the diffracted light and optical waveguide can be improved.

Moreover, in the case that the incident light is the polarization (TE polarization) parallel to the longitudinal axial direction of the slit-like opening, if the period of the MSM electrode 1 is made to be less than or equal to the wavelength, a waveguide mode will not exist in the opening part. However, sufficient transmittance can be obtained by adjusting the thickness of the MSM electrode 1 and providing the anti-reflection film 2.

Furthermore, to any orthogonal polarization direction, the Fabry Perot resonator is formed between the metal periodic structure and the Bragg reflection multilayer film, and thus the efficiency improves. As a result, high efficiency is obtained to any polarization, and thereby reducing the polarization dependence.

As described so far, according to the present invention, by efficiently generating the diffracted light and coupling to the light absorption layer highly efficiently, high quantum efficiency can be achieved even in a thin light-absorbing layer. Therefore, it is possible to achieve both high efficiency and high-speed response, and realize a semiconductor light-receiving element with small dependency on the incident polarization direction.

EXAMPLE 1

Figure 5:
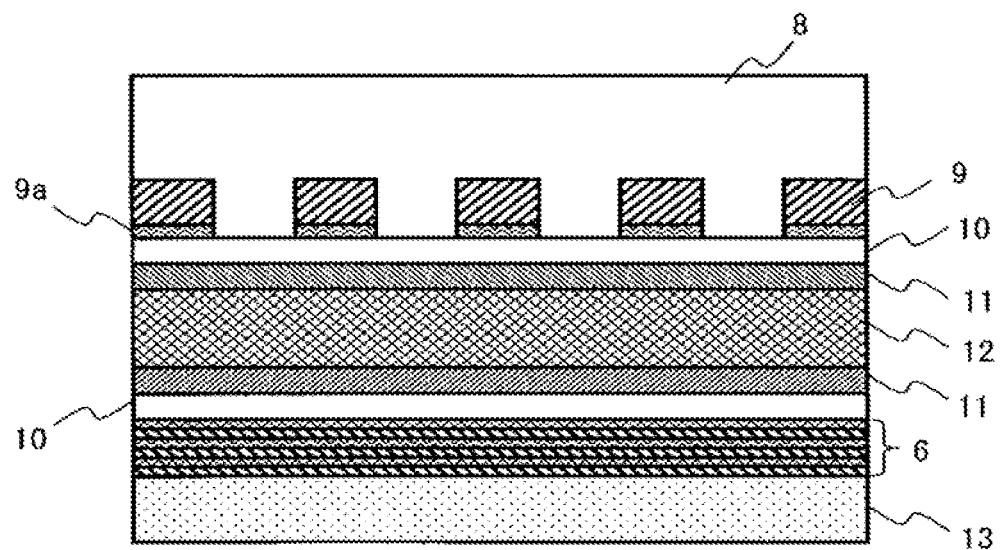
FIG. 5 is a cross-sectional diagram showing a configuration of an MSM type photodiode according to an example 1.
Figure 6:
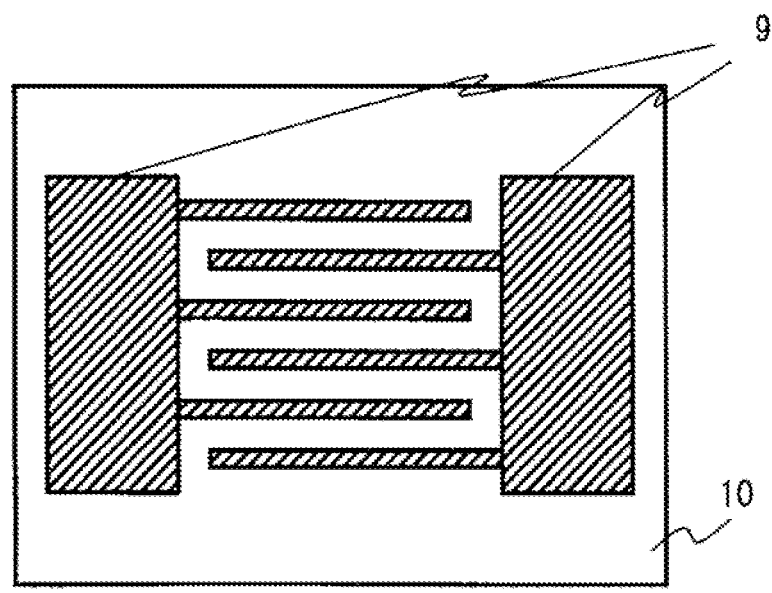
FIG. 6 is a plan view showing the configuration of the MSM type photodiode according to the example 1.

FIG. 5 is a cross-sectional diagram showing an example 1 of the MSM type photodiode according to the first embodiment of the present invention, and FIG. 6 is the plan view thereof. The MSM type photodiode of the example 1 includes an InP substrate 13, an InAlAs layer 10, a graded layer 11, an InGaAs layer 12, a Ti/Au electrode 9, and a SiN film 8.

The Bragg reflection multilayer film 6 formed of InGaAsP/InP is provided over the InP substrate 13. The InAlAs layer 10 to be a lower spacer layer is provided over the Bragg reflection multilayer film 6. Over the film, the InGaAs layer 12 to be a light-absorbing layer is provided with the graded layer 11 interposed therebetween. Over the layer, the InAlAs layer 10 to be an upper spacer layer is provided with the graded layer 11 interposed therebetween. Over the InAlAs layer 10, the Ti/Au electrodes 9 are formed with an adhesion layer 9a interposed therebetween, and the SiN film 8 is formed as an anti-reflection film.

These compound semiconductor layers can be grown using metal organic chemical vapor deposition or molecular beam epitaxy. In an interface of the InAlAs layer 10 and the Ti/Au electrode 9, a favorable Schottky junction is formed and the InGaAs layer 12 is depleted. When an incident light wavelength is 1.3 μm or 1.55 μm, which is used in the optical communications, for example, it is possible for InGaAs to have a sufficiently large absorption coefficient and realize a highly efficient photodiode. In this example, a comb-like electrode as the one shown in FIG. 6 is used.

EXAMPLE 2

Figure 7:
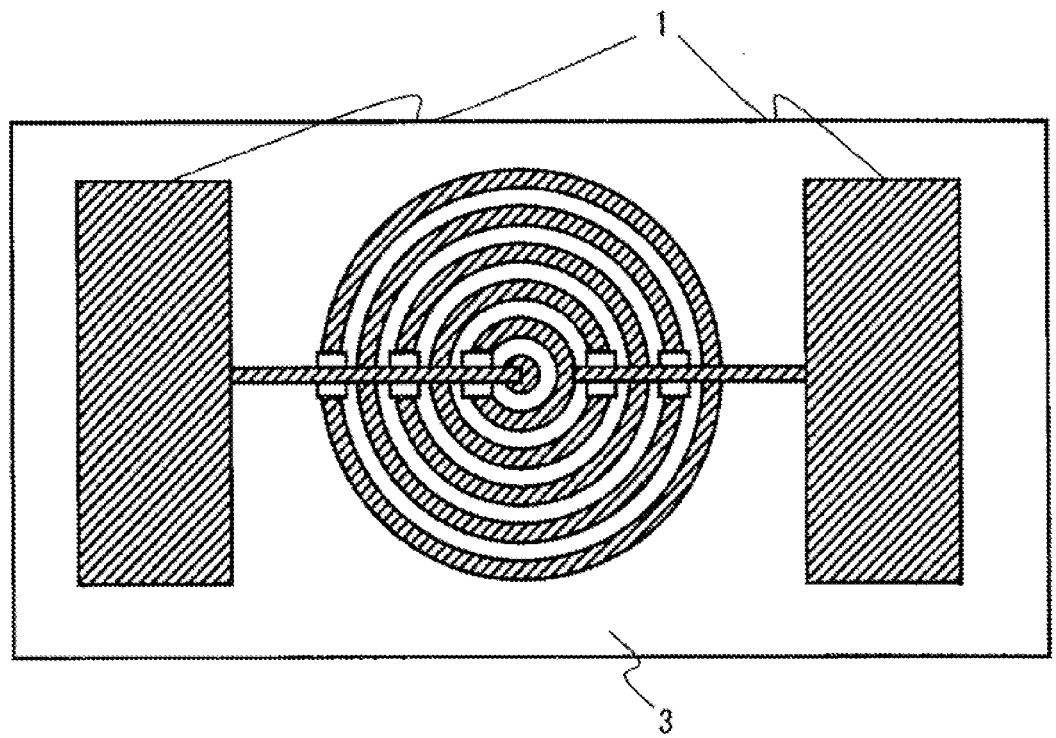
FIG. 7 is a plan view showing a configuration of an MSM type photodiode according to an example 2.

FIG. 7 is a plan view showing an example 2 of the MSM type photodiode according to the first embodiment of the present invention. As shown in FIG. 7, although the MSM type photodiode of the example 2 is based on the first embodiment, it differs from the photodiode of the example 1 shown in FIG. 6 in that the planar structure of the MSM electrode 1 is concentric periodic structure.

Figure 8:
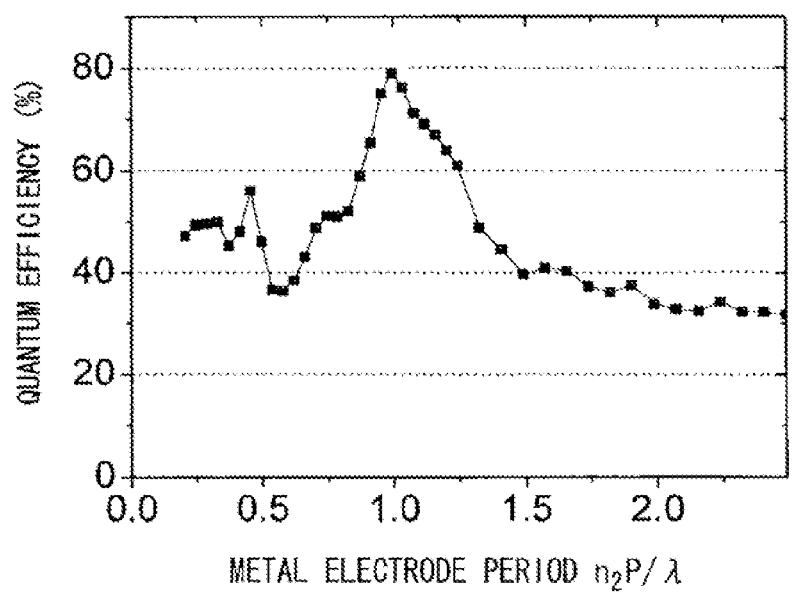
FIG. 8 is a view showing the MSM electrode period P dependence of the quantum efficiency in the example 2.

Although high quantum efficiency is obtained to any polarization direction by adjusting the structure of the MSM electrode 1 in the present invention, in this example, it has the concentric circular periodical structure additionally. Therefore, polarization dependence can be eliminated. As a result, it is possible to obtain high quantum efficiency to unpolarized incident light, such as emitted light from an optical fiber. The period P dependence of the quantum efficiency in this example is shown in FIG. 8. It can be seen from this drawing that as high quantum efficiency is obtained to a wide period range, a manufacturing process margin is wide and the wavelength band is extended.

Second Embodiment

Figure 9:
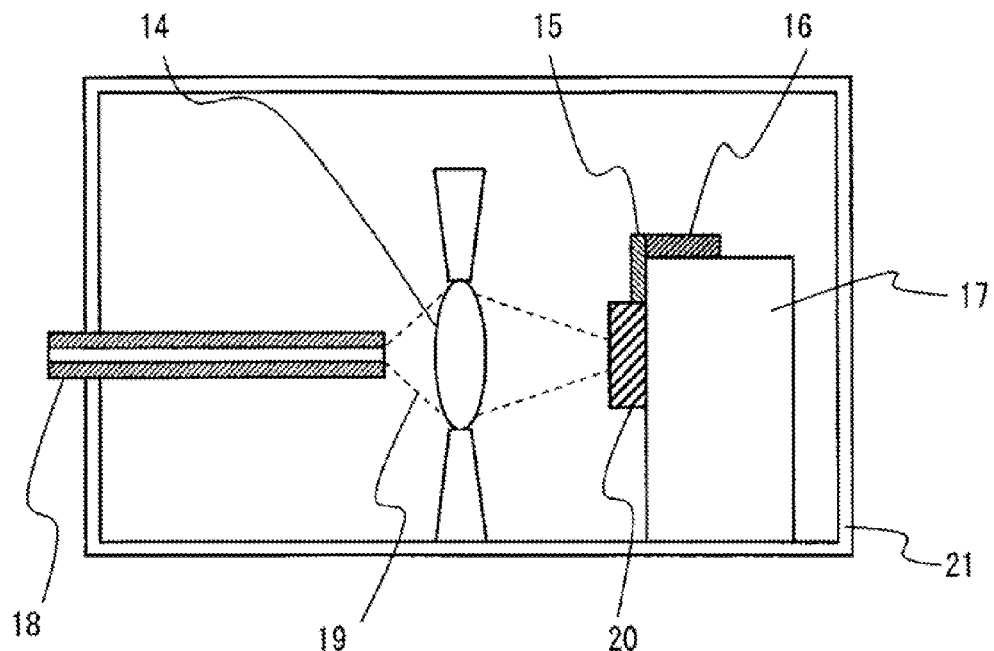
FIG. 9 is a cross-sectional diagram showing a configuration of an optical receiver module carrying the photodiode of the present invention according to a second embodiment.

An example applying a photodiode of the present invention is explained with reference to FIG. 9. FIG. 9 is a cross-sectional diagram showing a configuration of an optical receiver module for 40 Gbps (gigabit per second) transmission carrying a photodiode 20 according to the present invention.

As shown in FIG. 9, an optical receiver module according to this embodiment includes a lens 14, an electric wiring 15, a preamplifier IC 16, a chip carrier 17, an optical fiber 18, signal light 19, a photodiode 20, and a module enclosure 21.

In the module enclosure 21, the optical fiber 18 is drawn from outside. Within the module enclosure 21, the photodiode 20 according to the present invention is placed opposing to an edge surface of the optical fiber 18. The lens 14 is provided between the edge surface of the optical fiber 18 and the photodiode 20. The lens 14 optically couples the optical fiber 18 and the photodiode 20, and concentrates an optical signal exiting from the optical fiber 18 on the light-receiving surface of the photodiode 20.

The photodiode 20 is mounted to the side surface of the chip carrier 17, and is connected to the preamplifier IC 16 of the subsequent stage, which is provided over the top surface of the chip carrier 17, via the electric wiring 15. The photodiode 20 converts the optical signal into an electric signal, and outputs the electric signal to the preamplifier IC 16 via the electric wiring 15. The preamplifier IC 16 amplifies the input electric signal.

Generally the MSM type photodiode has a smaller element capacity than the pin type. Therefore, the light-receiving surface can be enlarged more while maintaining high-speed property than in the case of the pin type. As a result, there is an advantage that coupling tolerance can be extended.

Third Embodiment

Figure 10:
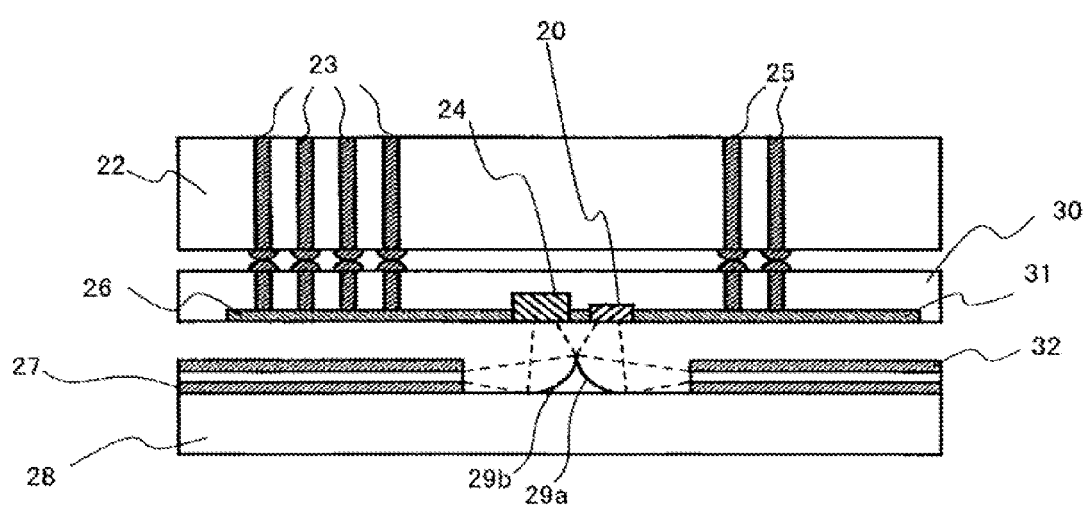
FIG. 10 is a cross-sectional diagram showing a configuration of an optical interconnect module between LSI chips carrying a photodiode by the present invention according to a third embodiment.

Another example applying a photodiode of the present invention is explained with reference to FIG. 10. FIG. 10 is a cross-sectional diagram showing a configuration of an optical interconnect module between LSI chips carrying the photodiode 20.

As shown in FIG. 10, the optical interconnect module according to this embodiment includes the photodiode 20, an LSI package 22, electric wiring vias for light source and modulation 23, a VCSEL (surface emitting laser: Vertical Cavity Surface Emitting Laser) light source 24, electric wiring vias for photodiode 25, electric wiring vias for light source and modulation 26, an optical signal output fiber 27, an LSI mounted board 28, concave mirrors 29, a photodiode/light source mounted board 30, an electric wiring layer for photodiode 31, and an optical signal input fiber 32.

The optical interconnect module converts the signal light from the optical fiber into an electric signal and supplies it to the LSI chip, and converts the electric signal output from the LSI chip into an optical signal and introduces it to a fiber.

The photodiode 20 and the VCSEL light source 24 are mounted over one surface of the photodiode/light source mounted board 30. The metal periodic structure as the one mentioned above is formed over the light-receiving surface of the photodiode 20.

The electric wiring layer for photodiode 31 and the electric wiring via for light source and modulation 26 are formed to the photodiode/light source mounted board 30. The photodiode 20 is connected to the electric wiring layer for photodiode 31, and the VCSEL light source 24 is connected to the electric wiring via for light source and modulation 26.

The photodiode/light source mounted board 30 is attached to the surface of the LSI package 22 that includes an LSI chip. The electric wiring vias for light source and modulation 23 and the electric wiring via for photodiode 25 are formed in the LSI package 22. The electric wiring vias for light source and modulation 23 are connected to the electric wiring via for light source and modulation 26. The electric wiring via for photodiode 25 is connected to the electric wiring layer for photodiode 31.

The LSI mounted board 28 is disposed opposing to such a photodiode/light source mounted board 30. The optical signal input fiber 32, the optical signal output fiber 27, and concave mirrors 29a and 29b are disposed over the surface of the LSI mounted board 28. The concave mirror 29a is disposed so that the optical signal from the optical signal input fiber 32 may be turned to the photodiode 20.

The concave mirror 29b is disposed so that a signal from the VCSEL light source 24 may enter the optical signal output fiber 27. The concave mirror 29a optically couples the optical signal input fiber 32 and the photodiode 20, and the concave mirror 29b optically couples the optical signal output fiber 27 and the VCSEL light source 24.

The optical signal from the optical signal input fiber 32 is reflected to the photodiode 20 according to the present invention by the concave mirror 29a, and current corresponding to the optical signal is transmitted to the LSI through the electric wiring layer for photodiode 31. The electric wiring layer for photodiode 31 is electrically connected to the electric wiring via for photodiode 25 of the LSI.

Note that other generally known methods, such as a planar optical waveguide, can also be used to input the optical signal instead of the optical fiber. Moreover, a concentration mechanism, such as a convex lens, can also be used instead of the concave mirror 29. Furthermore, a preamplifier for amplifying an electric signal can also be placed in the middle of the electric wiring layer for photodiode 31, which is immediately behind the photodiode 20.

The electric signal from the LSI passes the electric wiring layer for light source and modulation 26 from the electric wiring via for the light source and modulation 23, and is converted into an optical signal by the VCSEL light source 24 that includes an electric modulation mechanism. The optical signal is reflected by the concave mirror 29b, and transmitted to the optical signal output fiber 27.

The VCSEL light source 24 including the electric modulation mechanism can be replaced by other known mechanisms that modulate light by electricity, for example a Mach-Zehnder type modulator that modulates light from an outside light source by an electro-optical effect or a thermooptical effect.

According to the present invention, as it is possible to realize a high-speed and highly efficient photodiode using Ge, which is compatible with a CMOS process of Si, integration and commercial production is easy and the manufacturing cost can be reduced.

Although the present invention has been described with reference to the embodiments, the present invention is not limited by above. Various modifications understood by a person skilled in the art can be made to the configuration and details of the present invention within the scope of the present invention.

The present application claims priority rights of and is based on Japanese Patent Application No. 2008-209455 filed on Aug. 18, 2008, the entire contents of which are hereby incorporated by reference.

Industrial Applicability

The present invention can be applied to an element and a method that convert an optical signal including infrared and ultraviolet, which is required in a communication field and information processing, into an electric signal at high-speed and also highly efficiently.

Reference Signs List

1 MSM ELECTRODE
2 ANTI-REFLECTION FILM
3 UPPER SPACER LAYER
4 LIGHT ABSORBING LAYER
5 LOWER SPACER LAYER
6 BRAGG REFLECTION MULTILAYER FILM
7 SUBSTRATE
8 SiN FILM
9 Ti/Au ELECTRODE
9a ADHESION LAYER
10 InAlAs LAYER
11 Graded LAYER
12 InGaAs LAYER
13 InP SUBSTRATE
14 LENS
15 ELECTRIC WIRING
16 PREAMPLIFIER IC
17 CHIP CARRIER
18 OPTICAL FIBER
19 SIGNAL LIGHT
20 PHOTODIODE
21 MODULE ENCLOSURE
22 LSI PACKAGE
23 ELECTRIC WIRING VIA FOR LIGHT SOURCE AND MODULATION
24 VCSEL LIGHT SOURCE
25 ELECTRIC WIRING VIA FOR PHOTODIODE
26 ELECTRIC WIRING VIA FOR LIGHT SOURCE AND MODULATION
27 OPTICAL SIGNAL OUTPUT FIBER
28 LSI MOUNTED BOARD
29a and 29b CONCAVE MIRROR
30 PHOTODIODE/LIGHT SOURCE MOUNTED BOARD
31 ELECTRIC WIRING LAYER FOR PHOTODIODE
32 OPTICAL SIGNAL INPUT FIBER

The invention claimed is:

1. A semiconductor light-receiving element comprising:
a semiconductor layer that includes a light-absorbing layer;
a metal periodic structure that is provided over the semiconductor layer, forms a Schottky junction with the semiconductor layer, and includes a slit-like opening, the metal periodic structure having a period capable of exciting surface plasmon to incident light of polarization vertical to a longitudinal axial direction of the slit-like opening and thickness capable of obtaining sufficient transmittance to the incident light of the polarization parallel to the longitudinal axial direction of the slit-like opening;
an anti-reflection film that is formed over the semiconductor layer and the metal periodic structure; and
a semiconductor multilayer reflective film that is provided to a lower part of the semiconductor layer;
wherein a Fabry Perot resonator is formed between the metal periodic structure and the semiconductor multilayer reflective film to any incident light of the polarization vertical to and the polarization parallel to the longitudinal axial direction of the slit-like opening, the semiconductor layer comprises:

an upper spacer layer that is formed between the light-absorbing layer and the metal periodic structure, the upper spacer layer being composed of semiconductor transparent to the incident light; and a lower spacer layer that is provided to the lower part of the light-absorbing layer and adjusts a phase in the Fabry Perot resonator, the lower spacer layer being composed of semiconductor transparent to the incident light, and light diffracted by the metal periodic structure is coupled to the light-absorbing layer, and when a thickness of the metal periodic structure is T, a width interval ratio is R, an incident light wavelength is $\lambda$, and the refractive index of the anti-reflection film is n1, $0.05 < n_1 T/\lambda < 0.20$ and $0.4 < R < 0.7$ are satisfied.

2. The semiconductor light-receiving device according to claim 1, wherein when a period of the metal periodic structure is P and a refractive index of the upper spacer layer is $n_2$, $0.90 < n_2 P/\lambda < 1.05$ is satisfied.

3. The semiconductor light-receiving element according to claim 1, wherein the metal periodic structure includes a comb-like or a concentric periodic structure.

4. The semiconductor light-receiving element according to claim 1, wherein in a light-receiving part, the metal periodic structure is composed from a plurality of periodic directions, a plurality of periods, or a plurality of width interval ratios.

5. The semiconductor light-receiving element according to claim 1, further comprising a substrate that is provided to the lower part of the semiconductor multilayer reflective film, wherein the semiconductor light-receiving element is composed so that light can enter from the substrate side.

6. The semiconductor light-receiving element according to claim 1, wherein the metal periodic structure includes at least one metal material among Al, Ag, Au, and Cu.

7. The semiconductor light-receiving element according to claim 1, wherein the light-absorbing layer is composed of at least one selected from Si, SixGel-x (where x is a positive number less than one), Ge, GaN, GaAs, and InGaAs.

8. The semiconductor light-receiving element according to claim 1, wherein the semiconductor layer has a laminated structure composed of a plurality of materials including a graded layer.

9. An optical communication device comprising the semiconductor light-receiving element according to claim 1 in a light-receiving part.

10. An optical interconnect module comprising:

a substrate including the semiconductor light-receiving element according to claim 1 formed thereover, and an LSI electronic circuit that is monolithically formed with the semiconductor light-receiving element over the substrate.

11. A photoelectric conversion method comprising:

diffracting light by a metal periodic structure that is provided over a semiconductor layer, forms a Schottky junction with the semiconductor layer, includes a slit-like opening, and has a period capable of exciting surface plasmon to incident light of polarization vertical to a longitudinal axial direction of the slit-like opening and a thickness capable of obtaining sufficient transmittance to the incident light of the polarization parallel to the longitudinal axial direction of the slit-like opening;

resonating the light diffracted by the metal periodic structure between the metal periodic structure and a semiconductor multilayer reflective film, the semiconductor multilayer reflective film being provided to a lower part of the semiconductor layer; and coupling the light diffracted by the metal periodic structure to a light-absorbing layer included in the semiconductor layer, forming a Fabry Perot resonator between the metal periodic structure and the semiconductor multilayer reflective film to any incident light of the polarization vertical to and the polarization parallel to the longitudinal axial direction of the slit-like opening; and in the semiconductor layer, adjusting a phase in the Fabry Perot resonator by a lower spacer layer that is provided to the lower part of the light-absorbing layer and composed of a semiconductor transparent to the incident light, when a thickness of the metal periodic structure is T, a width interval ratio is R, and incident light wavelength is $\lambda$, and the refractive index of the anti-reflection film is $n_1$, $0.05 < n_1 T/\lambda < 0.20$ and $0.4 < R < 0.7$ are satisfied.

* * * * *